United States Patent [19]

Hayamizu

[11] Patent Number: 5,257,388
[45] Date of Patent: Oct. 26, 1993

[54] DEVICE FOR DETECTING WHETHER AN ATTACHED EXTERNAL MEMORY STORES VALID DATA, IF NOT, WHETHER THE EXTERNAL MEMORY IS CAPABLE OF STORING DATA

[75] Inventor: Kazuhiro Hayamizu, Hashima, Japan

[73] Assignee: Brother Kogyo Kabushiki Kaisha, Aichi, Japan

[21] Appl. No.: 514,702

[22] Filed: Apr. 26, 1990

[30] Foreign Application Priority Data

Apr. 27, 1989 [JP] Japan .................................. 1-108526

[51] Int. Cl.$^5$ .......................... G06F 11/00; G06F 7/04
[52] U.S. Cl. .................................. 395/800; 235/380;
400/61; 365/201; 360/133; 360/135; 371/21.2;
364/952.1; 364/953.3; 364/DIG. 2
[58] Field of Search ................ 395/800, 275; 235/380;
400/61; 365/201; 360/133, 135; 371/21.2

[56] References Cited

U.S. PATENT DOCUMENTS

| | | | |
|---|---|---|---|
| 4,578,722 | 3/1986 | Lovgren et al. | 360/60 |
| 4,611,314 | 9/1986 | Ogata et al. | 369/32 |
| 4,660,999 | 4/1987 | Tsuneki | 400/61 |
| 4,742,485 | 5/1988 | Carlson et al. | 364/419 |
| 4,760,575 | 7/1988 | Watanabe | 371/21.2 |
| 4,763,281 | 8/1988 | Arakawa | 395/110 |
| 4,826,332 | 5/1989 | Ukai et al. | 400/70 |
| 4,865,321 | 9/1989 | Nakagawa et al. | 417/381 |
| 4,902,146 | 2/1990 | Ishikawa | 400/61 |
| 4,926,347 | 5/1990 | Uchida et al. | 395/112 |
| 4,926,373 | 5/1990 | Takenaka | 395/112 |
| 4,958,337 | 9/1990 | Yamanaka et al. | 369/58 |
| 5,060,198 | 10/1991 | Kowalski | 365/201 |
| 5,093,915 | 3/1992 | Platteter et al. | 395/700 |

FOREIGN PATENT DOCUMENTS

0114186A1  8/1984  European Pat. Off. .
0217668A2  4/1987  European Pat. Off. .

Primary Examiner—Thomas C. Lee
Assistant Examiner—Paul Harrity
Attorney, Agent, or Firm—Kane, Dalsimer, Sullivan, Kurucz, Levy, Eisele and Richard

[57] ABSTRACT

In a data processing device capable of attachably and detachably providing an external memory unit to which data are written and from which data are read, the external memory unit being capable of storing data even when it is not provided on the data processing device, provided are discriminating means for discriminating whether the external memory unit is provided on the data processing device, judging means for judging whether predetermined kind of data are stored in the external memory unit in case that it is discriminated that the external memory unit is provided on the data processing device, and another judging means for judging at least whether the predetermined kind of data stored in the external memory unit are operable in case that it is judged by the judging means that the predetermined kind of data are stored in the external memory unit. Thus, since a conventional check operation for the external memory unit is not executed, in the data processing device according to the present invention, when the predetermined kind of data are stored, the predetermined kind of data are not destroyed.

13 Claims, 4 Drawing Sheets

DEVICE FOR DETECTING WHETHER AN ATTACHED EXTERNAL MEMORY STORES VALID DATA, IF NOT, WHETHER THE EXTERNAL MEMORY IS CAPABLE OF STORING DATA

BACKGROUND OF THE INVENTION

The present invention relates to a data processing device capable of providing an external memory, such as a RAM (Random Access Memory) card, for storing data supported by a built-in power supply and the like, more particularly to a data processing device capable of checking whether the RAM card is employable in the data processing device.

In a data processing device, such as a printer arranged to read character and/or symbol data and print the data on a printing sheet, with a RAM card, it is necessary to check whether the RAM card can be used in the data processing device. Therefore, a RAM card checking operation is executed, when a power supply of the data processing device is turned on, in the following manner.

Some predetermined data are written into particular addresses of the RAM card, the written data are read out, and then the read data are compared with the written data. When the former accords with the latter, it is determined that the storage area is normally used and the card can be used as an external memory.

Recently, a RAM card, with a built-in power supply for electrically supporting the stored data in the RAM card. i.e., so-called back-up power supply, even after the power supply of the data processing device is turned off, or the RAM card is removed from the data processing device, have been used. However, in such a RAM card, when there are download data consisting of dot patterns of characters to be used by an operator, if the checking operation described above is executed, data in the RAM card will be destroyed.

SUMMARY OF THE INVENTION

It is therefore an object of the invention to provide an improved data processing device capable of preventing from destroying the data stored in the RAM card.

For this purpose, according to the present invention, there is provided a data processing device capable of attachably and detachably providing an external memory unit to which data are written and from which data are read, said external memory unit being capable of storing data even when it is not provided on said data processing device, said data processing device comprising:

discriminating means for discriminating whether said external memory unit is provided on said data processing device;

judging means for judging whether predetermined kind of data are stored in said external memory unit in case that it is discriminated that said external memory unit is provided on said data processing device; and another judging means for judging whether said predetermined kind of data stored in said external memory unit are usable in case that it is judged by said judging means that said predetermined kind of data are stored in said external memory unit.

DESCRIPTION OF THE ACCOMPANYING DRAWINGS

DESCRIPTION OF THE EMBODIMENTS

Figure 1:
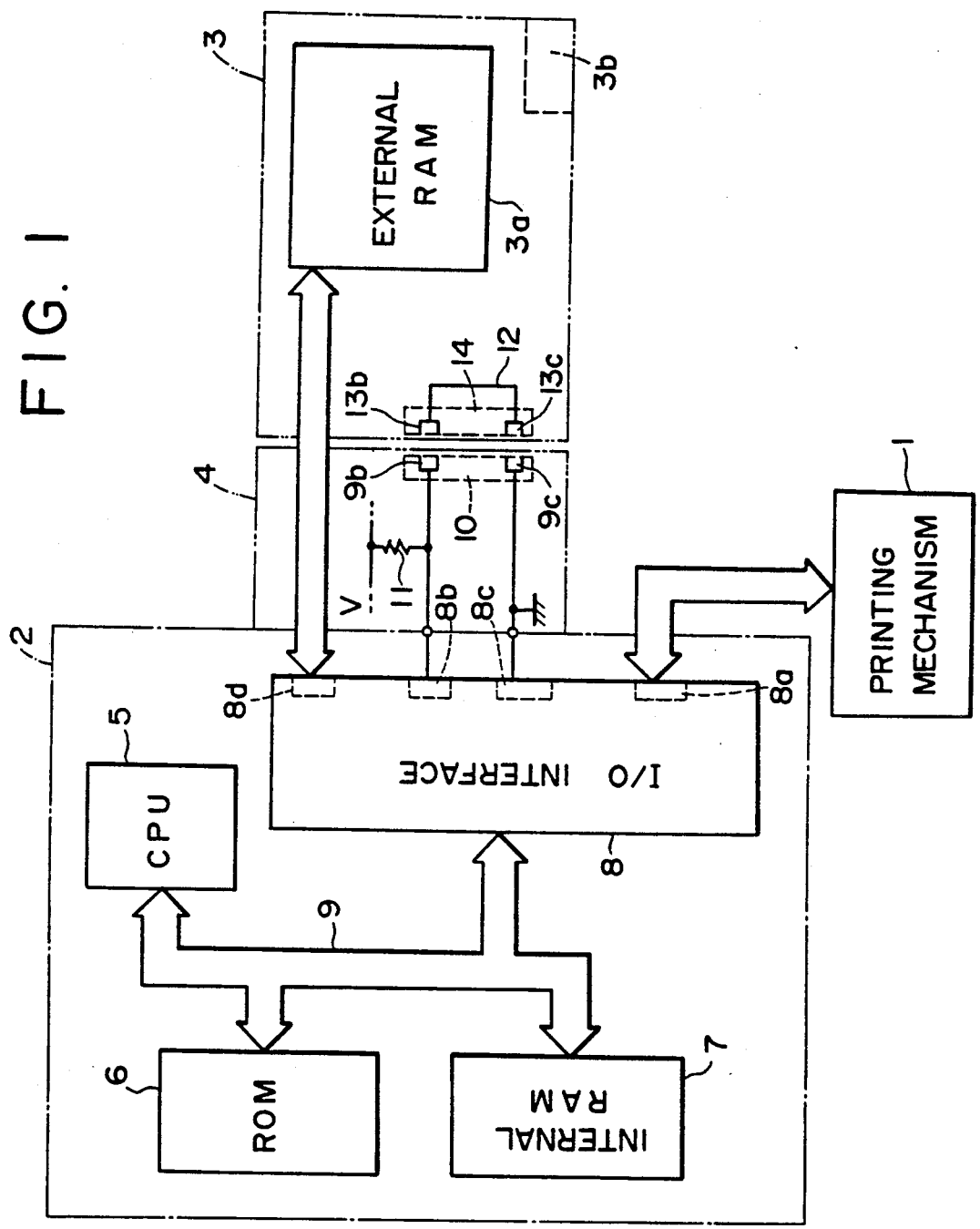
FIG. 1 is a block diagram of a principal portion of a data processing device, including a printing mechanism, according to the present invention.

Referring with the accompanying drawings, an embodiment of the present invention will be described hereinafter. FIG. 1 shows an outlined view of a printer as one embodiment of a data processing device according to the present invention which can be equipped with an I.C. (Integrated Circuit) card, for example, RAM card, with a back-up power supply.

The printer is provided with a printing mechanism 1, an electronic control unit 2, an I.C. card detection device 4 for detecting whether an I.C. card 3 is mounted or not, each of which is known.

The printing mechanism 1 comprises well-known a carriage drive mechanism and its drive circuit for moving a carriage which is equipped with a print head in the longitudinal direction of a platen, a sheet feed mechanism and its drive circuit for feeding a print sheet by using a motor, and a print head drive circuit, and so forth, each of which is not shown.

The electronic control unit 2 is provided with a CPU (Central Processing Unit) 5, a ROM (Read Only Memory) 6, an internal RAM (Random Access Memory) 7, and an I/O (Input/Output) interface 8 having at least four I/O ports 8a through 8d, each of which is known and electrically connected by means of a well-known data bus 9 and the like. The I/O port 8a of the I/O interface 8 is electrically connected to the print mechanism 1. The I.C. card detection device 4 is connected to the I/O ports 8b through 8d. When the I.C. card 3 is attached, an external RAM 3a is connected to the I/O port 8d. In the ROM 6 of the electronic control unit 2, a program for controlling the printing mechanism 1 according to various code data and another program, illustrated in FIGS. 2 and 3 described later, for checking whether or not the print mechanism 1 can be used when a power source of the printer, not shown, is turned on.

The I.C. card 3 is provided with the external RAM 3a and an internal power supply 3b for supplying a data backup power to the external RAM 3a. The storage area of the external RAM 3a comprises a download buffer area "D" for storing download data consisting of pattern data corresponding to the characters which are originally used by the operator, and an I.D. (IDentification) area for storing additional information of the I.C. card 3 identifying the I.C. card. In the I.D. area, when the operator causes the external RAM 3a to store the download data, a flag F.D. (Flag Data), for indicating that the download data are stored, is set. In this I.D. area, a result in which all data of the download buffer area are added is stored as a check value "T". This check value "T" is updated whenever the operator causes the external RAM 3a to store the download data.

Figure 2:
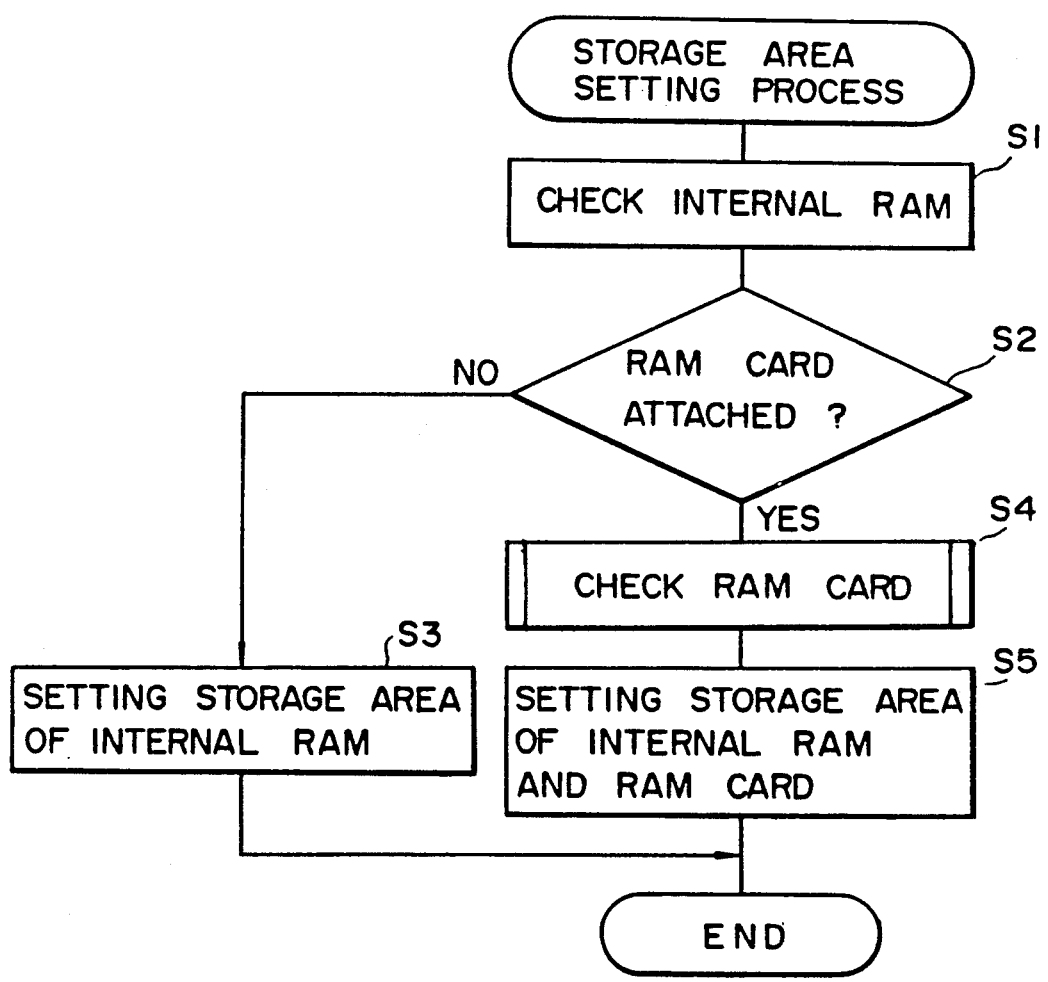
FIG. 2 is a flow chart for a storage area setting operation employed in a data processing device according to the present invention.

The I.C. card detection device 4 shown in FIG. 2 is provided with a connector 10 having terminals 9b and 9c connected to two ports 8b and 8c of the I/O interface 8, the terminal 9b being connected to a reference voltage "V" via a resister 11, the other terminal 9c being grounded. The I.C. card 3 is provided with a connector 14 having terminals 13b and 13c which are shortcircuited with a lead wire 12, the terminals 13b and 13c being respectively connected to the terminals 9b and 9c.

An operation of the I.C. card detection device 4 will be described hereinafter. When the I.C. card 3 is not attached to the printer, since the terminal 9b is not connected to the terminal 9c, the reference voltage "V" occurs between the terminals 9b and 9c, a "H" level signal being applied between the terminals 9b and 9c. On the other hand, when the I.C. card 3 is attached to the printer, the terminals 9b and 9c are in contact with terminals 13b and 13c and they are shortcircuited with the lead wire 12. Thus, since no voltage occurs between the terminals 9b and 9c, a "L" level voltage is applied to the I/O port 8b. Whether or not the I.C. card 3 is attached is detected depending on the voltage of the I/O port 8b.

Figure 3:
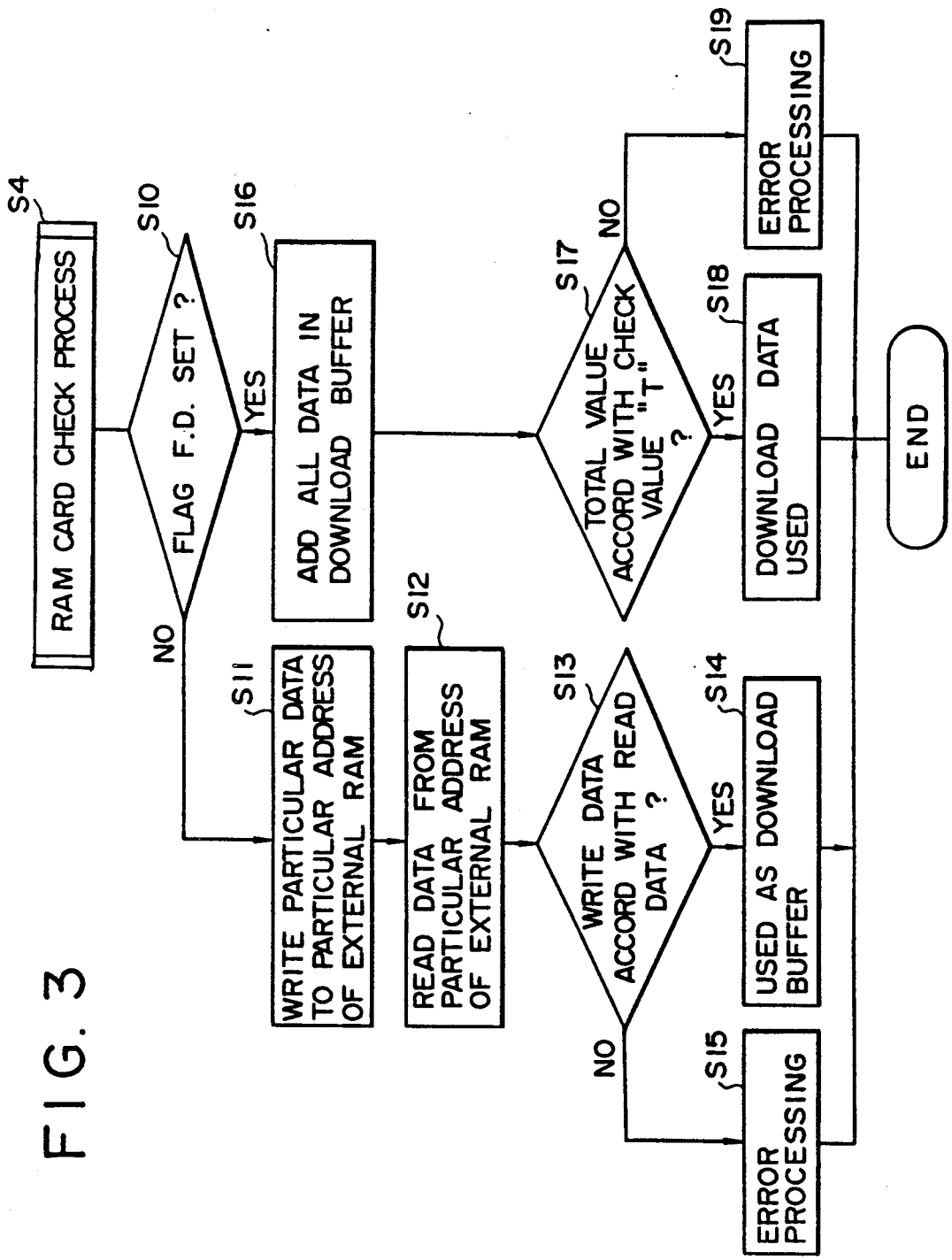
FIG. 3 is a flowchart showing a RAM card checking operation employed in the data processing device according to the present invention.
Figure 4:
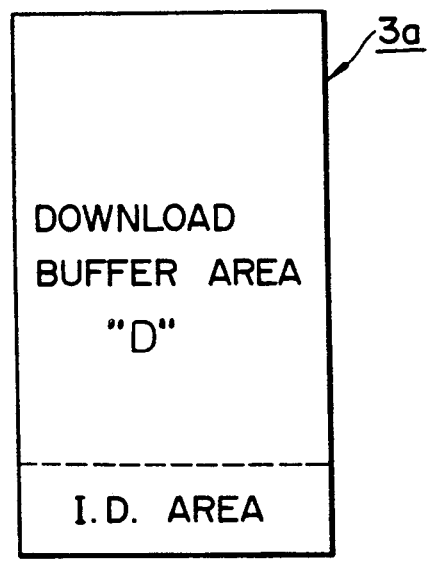
FIG. 4 is a descriptive schematic showing a storage area map of the RAM card.

Then, by referring to FIGS. 2 and 3, an initialize process for the I.C. card 3 and the like which is executed when the power source of the printer is turned on will be described hereinafter. In the following description, any step is abbreviated as "S".

As illustrated in FIG. 2, in S1, the internal RAM 7 is checked in the following well-known method. Namely, particular data are written at particular addresses of the internal RAM 7, the data is read, and the both data are compared with each other. If the former accords with the latter, it is determined that the internal RAM 7 is normal. When the internal RAM 7 is normal, it is used as a printer buffer. When it is determined that the internal RAM 7 is abnormal, an error indication occurs. In S2, it is determined whether or not the I.C. card 3 is attached. In this determination process, the I.C. card detection device 4 shown in FIG. 1 determines whether or not the reference voltage "V" is applied to the I/O port 8b of the I/O interface 8. When it is determined that the I.C. card 3 is not attached in S2, the process advances to S3. In S3, a storage area of the internal RAM 7 is set. The storage area to be set comprises, for example, a working area for receiving data and for setting flags, an input buffer area for temporarily storing data sent from a host computer, an image buffer area for extending image data to image data, and a download buffer area for storing download data.

On the other hand, if it is determined that the I.C. card 3 is attached in S2, the process advances to S4. In S4, the check process of the I.C. card 3 is executed. In this process, a program according to the flowchart shown in FIG. 3 is executed. In other words, in S10, a state of the flag F.D. is read from the I.D. area of the external RAM 3a and the determination is executed. When the flag F.D. is not set, it is determined that the download data is not stored. The process advances to S11. In S11, the check process like S1 shown in FIG. 2 is executed. In other words, particular data are written to particular addresses of the external RAM 3a of the I.C. card 3 in S11, the data are read out in S12, and then it is determined whether or not the former data accords with the latter data in S13. When the written data accords with the read data, it is determined that the I.C. card 3 is normal and it is used as the download buffer in S14. When the written data does not accord with the read data, an error indication occurs in S15.

On the other hand, when it is determined that the flag F.D. is set in S10, the process advances to S16. In S16 or later steps, a sum check process is executed in the following manner. All data stored in the download buffer are added in S16 and then it is determined whether or not the total value accords with the check value "T" stored in the I.D. area in S17. When the former accords with the latter, it is determined that the download data is normal and it can be used as the data to be processed in S18. When the former does not accord with the latter, it is determined that the download data is abnormal and an error indication occurs in S19. In S5 shown in FIG. 2, the storage area of the internal RAM 7 is separated into the working area, input buffer area, and image buffer area as like in S3, while the external RAM 3a is separated same as the internal RAM 7.

Thus, according to the present invention, when the I.C. card 3 with a backup power does not store the download data, the conventional RAM check process for determining whether or not the storage area can be used via the write, read, and compare processes is executed. On the other hand, when the I.C. card 3 stores the download data, the sum check process for adding the portions used for the download data is executed. Consequently, the download data stored in the I.C. card 3 is not destroyed by the check process.

When a RAM card without the internal power supply 3b is used as the I.C. card 3, if the RAM card is detached from the printer or the printer power is turned off, the data stored in the RAM card is erased. To prevent that, in the flowchart shown in FIG. 3, the determination of S10 becomes "NO" and the conventional RAM check process is executed. Thus, in the printer according to the present invention, a RAM card without a backup power supply can be checked.

In this embodiment, the I.C. card 3 is provided with the external RAM 3a and the internal power supply 3b. However, it is possible to use an EP-ROM (Erasable and Programmable ROM) instead of the I.C. card 3.

What is claimed is:

1. A data processing device adapted to attachably and detachably couple with an external memory unit to which data are written and from which data are read, said external memory unit storing data even when not coupled to said data processing device, said data processing device comprising:

discriminating means for determining whether said external memory unit is coupled to said data processing device;

judging means for judging if a predetermined kind of data are stored in said external memory unit when said discriminating means determines that said external memory unit is coupled to said data processing device;

another judging means for judging if said predetermined kind of data stored in said external memory unit are usable when said judging means judges that said predetermined kind of data are stored in said external memory unit, said another judging means including means for performing a sum check on said predetermined data and comparing said sum check result with a sum result stored in said external memory unit;

error indicating means for indicating that said predetermined kind of data are not usable when said another judging means judges that said predetermined kind of data are not usable; and, third judging means for judging whether said external memory unit is capable of storing data when said judging means judges that said predetermined kind of data are not stored in said external memory unit, said third judging means including means for writing test data to said external memory unit, means for reading said test data from said external memory unit and means for comparing said test data read from said external memory unit with said known test data whereby to check the integrity of said external memory unit.

2. The data processing device according to claim 1, which further comprises printing means coupled to said data processing device for printing at least the data stored in said external memory unit.

3. The data processing device according to claim 1, wherein said predetermined kind of data comprises download data.

4. The data processing device according to claim 1, wherein said external memory unit comprises a RAM card having a back-up power supply unit.

5. The data processing device according to claim 1, wherein said external memory unit comprises an EP-ROM.

6. The data processing device according to claim 1, wherein said discriminating means comprises a converting mechanism for converting a voltage at a predetermined position in said data processing device to grounded voltage when said discriminating means determines that said external memory unit is coupled to said data processing device.

7. The data processing device according to claim 6, wherein said converting mechanism comprises an electrical circuit by which said voltage at said predetermined position is connected to ground through a predetermined resistance value if said external memory unit is coupled to said data processing device.

8. A printing device, comprising at least an internal memory unit for storing data to be printed and a printing mechanism for printing at least the data stored in said internal memory unit on a printing sheet, said printing device being attachably and detachably coupled to an external memory unit to which data are written and from which data are read, said external memory unit storing data even when not coupled to said printing device, said printing device further comprising:

discriminating means for determining whether said external memory unit is coupled to said printing device;

judging means for judging if a predetermined kind of data are stored in said external memory unit when said discriminating means determines that said external memory unit is coupled to said printing device;

another judging means for judging if said predetermined kind of data stored in said external memory unit are usable when said judging means judges that said predetermined kind of data are stored in said external memory unit, said another judging means including means for performing a sum check on said predetermined data and comparing said sum check result with a sum result stored in said external memory unit;

error indicating means for indicating that said predetermined kind of data are not usable when said another judging means judges that said predetermined kind of data are not usable; and, third judging means for judging whether said external memory unit is capable of storing data when said judging means judges that said predetermined kind of data are not stored in said external memory unit, said third judging means including means for writing test data to said external memory unit, means for reading said test data from said external memory unit and means for comparing said test data read from said external memory unit with said known test data whereby to check the integrity of said external memory unit.

9. The printing device according to claim 8, wherein said predetermined kind of data comprises download data.

10. The printing device according to claim 8, wherein said external memory unit comprises a RAM card having a back-up power supply unit.

11. The printing device according to claim 8, wherein said external memory unit comprises an EP-ROM.

12. The printing device according to claim 8, wherein said discriminating means comprises a converting mechanism for converting a voltage at a predetermined position in said printing device to grounded voltage when said discriminating means determines that said external memory unit is coupled to said printing device.

13. The printing device according to claim 12, wherein said converting mechanism comprises an electrical circuit by which said voltage at said predetermined position is connected to ground through a predetermined resistance value if said external memory unit is coupled to said printing device.

* * * * *